United States Patent
Kim et al.

(10) Patent No.: US 8,982,307 B2
(45) Date of Patent: Mar. 17, 2015

(54) PIXEL UNIT, ARRAY SUBSTRATE, LIQUID CRYSTAL PANEL AND METHOD FOR MANUFACTURING THE ARRAY SUBSTRATE

(71) Applicant: Boe Technology Group Co., Ltd., Beijing (CN)

(72) Inventors: Heecheol Kim, Beijing (CN); Chao Xu, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 10 days.

(21) Appl. No.: 13/703,567

(22) PCT Filed: Sep. 28, 2012

(86) PCT No.: PCT/CN2012/082347
§ 371 (c)(1),
(2) Date: Dec. 11, 2012

(87) PCT Pub. No.: WO2013/056617
PCT Pub. Date: Apr. 25, 2013

(65) Prior Publication Data
US 2014/0125909 A1    May 8, 2014

(30) Foreign Application Priority Data
Oct. 17, 2011 (CN) .......................... 2011 1 0315240

(51) Int. Cl.
*G02F 1/1343* (2006.01)
*G02F 1/1362* (2006.01)
*H01L 27/12* (2006.01)

(52) U.S. Cl.
CPC .... *G02F 1/136209* (2013.01); *G02F 1/134309* (2013.01); *H01L 27/124* (2013.01); *G02F 2001/134381* (2013.01); *G02F 2001/136218* (2013.01); *G02F 2201/40* (2013.01)
USPC ........................................................ 349/141

(58) Field of Classification Search
CPC ..................... G02F 1/134363; G02F 1/133707
USPC ........................................................ 349/141
See application file for complete search history.

(56) References Cited

U.S. PATENT DOCUMENTS

| 6,597,420 | B2 | 7/2003 | Kim et al. |
| 7,663,710 | B2 * | 2/2010 | Park et al. ....................... 349/54 |

(Continued)

FOREIGN PATENT DOCUMENTS

| CN | 101021658 A | 8/2007 |
| CN | 101349838 A | 1/2009 |

(Continued)

OTHER PUBLICATIONS

International Search Report mailed Oct. 1, 2013; PCT/CN2012/082347.

(Continued)

*Primary Examiner* — Lucy Chien
(74) *Attorney, Agent, or Firm* — Ladas & Parry LLP

(57) ABSTRACT

Embodiments of the present invention disclose a pixel unit, an array substrate, a liquid crystal panel, a display device and a manufacturing method thereof. The pixel unit comprises a thin film transistor, a pixel electrode and a common electrode, the thin film transistor comprising a gate electrode, a gate insulating layer provided on the gate electrode, an active layer provided on the gate insulating layer, a source electrode and a drain electrode provided on the active layer, and a passivation layer provided on the source electrode and the drain electrode; wherein the common electrode is provided directly on the passivation layer; and the pixel electrode is provided under the passivation layer and is connected to the drain electrode of the thin film transistor. For the array substrate, the liquid crystal panel, the display device and the manufacturing method thereof, it is possible to increase view angles, lower power consumption, and increase aperture ratio, thereby improving display quality.

14 Claims, 7 Drawing Sheets

(56) References Cited

U.S. PATENT DOCUMENTS

| | | |
|---|---|---|
| 2002/0067453 A1 | 6/2002 | Kim et al. |
| 2008/0002123 A1* | 1/2008 | Kim ............................ 349/139 |
| 2008/0100787 A1* | 5/2008 | Segawa et al. ............... 349/141 |
| 2008/0117369 A1 | 5/2008 | Chen et al. |
| 2009/0086117 A1 | 4/2009 | Chen |
| 2012/0133856 A1* | 5/2012 | Ono .............................. 349/42 |

FOREIGN PATENT DOCUMENTS

| | | |
|---|---|---|
| CN | 101398582 A | 4/2009 |
| CN | 102645803 A | 8/2012 |
| JP | 11-125835 A | 5/1999 |
| KR | 1020010003748 A | 1/2001 |
| KR | 20030053562 A | 7/2003 |
| KR | 1020050112645 A | 12/2005 |
| KR | 1020060023807 A | 3/2006 |
| KR | 100713882 B1 | 5/2007 |

OTHER PUBLICATIONS

International Preliminary Report on Patentability dated Apr. 22, 2014; PCT/CN2012/082347.
First Chinese Office Action dated Nov. 1, 2013; Appln. No. 201110315240.7.
First Korean Office Action dated Feb. 24, 2014; Appln. No. 10-2012-7032426.
Korean Office Action dated Aug. 29, 2014; Appln. No. 10-2012-7032426.
Korean Examination Opinion dated Nov. 10, 2014; Appln. No. 10-2012-7032426.

* cited by examiner

PIXEL UNIT, ARRAY SUBSTRATE, LIQUID CRYSTAL PANEL AND METHOD FOR MANUFACTURING THE ARRAY SUBSTRATE

CROSS REFERENCE TO RELATED APPLICATIONS

This application is a national stage application under 35 U.S.C. 371 and claims the benefit of PCT Application No. PCT/CN2012/082347 having an international filing date of Sep. 28, 2012, which designated the United States, which PCT application claimed the benefit of Chines Application No. 201110315240.7 filed Oct. 17, 2011 the disclosure of each of which are incorporatd herein by reference.

TECHNICAL FIELD

Embodiments of the present invention relate to a pixel unit, an array substrate, a liquid crystal panel, a display device and a method for manufacturing the same.

BACKGROUND

Liquid Crystal Displays (LCDs) have characteristics such as small volume, low power consumption, radiation-free, etc., and have been prevailed in the field of flat display. Thin film transistor liquid crystal displays (TFT-LCDs) are the mainstream of liquid crystal displays at present.

A liquid crystal panel of the liquid crystal display comprises an array substrate and a color filter substrate. A gate line is disposed on the array substrate, a data line is disposed perpendicular to the gate line, and the gate line and the data line intersect each other to define a pixel region; a thin film transistor and a pixel electrode are disposed within the pixel region; and a gate electrode of the thin film transistor is connected to the gate line, a source electrode thereof is connected to the data line, and a drain electrode thereof is connected to the pixel electrode.

The array substrate is a key component of the liquid crystal display panel, and a pixel structure composed of the thin film transistor and the pixel electrode and so on is an important element of the array substrate. A conventional TN mode liquid crystal display has characteristics such as relatively small viewing angles, unable to meet requirements of a high-quality display, etc.

In an Advanced-Super Dimensional Switching (AD-SDS) technology, a multi-dimensional electric field is formed by an electric field produced at edges of a slit electrode on a same plane and an electric field produced between a slit electrode layer and a plate-like electrode layer so as to allow liquid crystal molecules at all orientations, which are located directly above the electrode and between the slit electrodes in a liquid crystal cell, to be rotated, thereby enhancing work efficiency of liquid crystals and increasing transmissive efficiency. The Advanced-Super Dimensional Switching technology can improve picture quality of TFT-LCD products, and has advantages of high resolution, high transmittance, low power consumption, wide viewing angles, high aperture ratio, low chromatic aberration, and push Mura-free, etc.

The structure of a conventional ADS pixel unit comprises: a thin film transistor, a pixel electrode, and a common electrode. The pixel electrode is located above the common electrode; the pixel electrode in the uppermost layer is connected to a drain electrode of the thin film transistor, and the common electrode in the lowermost layer is connected to a common electrode line. Although a conventional ADS mode liquid crystal panel has advantages such as high resolution, high transmittance, low power consumption, wide viewing angle, high aperture ratio, low chromatic aberration, and push Mura-free, etc as compared with a conventional TN mode, the conventional ADS still has a smaller aperture ratio due to its own characteristics and cannot meet a requirement of high-quality display.

SUMMARY

Embodiments of the invention realized an improvement upon the conventional ADS mode, and intended to provide a novel I-ADS type pixel unit, an array substrate, a liquid crystal display, display device and manufacturing method thereof, for increasing aperture ratio of pixels, lowering power consumption, and enhancing display quality.

An aspect of the invention provides a pixel unit, comprising a thin film transistor, a pixel electrode and a common electrode, the thin film transistor comprising a thin film transistor, a pixel electrode and a common electrode, the thin film transistor comprising a gate electrode, a gate insulating layer provided on the gate electrode, an active layer provided on the gate insulating layer, a source electrode and a drain electrode which are provided on the active layer, and a passivation layer provided on the source electrode and the drain electrode, wherein the common electrode is provided directly on the passivation layer; and the pixel electrode is provided under the passivation layer and is connected to the drain electrode of the thin film transistor.

For example, the pixel electrode and the gate electrode are disposed in a same layer, a gate insulating layer is disposed between the passivation layer and the pixel electrode, and a metal electrode in the same layer as the common electrode is connected to the drain electrode of the thin film transistor and the pixel electrode through two via holes, respectively.

For example, the common electrode takes a slit shape and the pixel electrode takes a plate shape.

For example, the connecting electrode in a same layer as the common electrode for connecting the pixel electrode and the drain electrode of the thin film transistor employs the same material as the common electrode.

For example, the pixel electrode and/or the common electrode are/is transparent electrode(s).

For example, the common electrode is a single-layer film of ITO or IZO, or a composite film composed of ITO and IZO.

For example, the passivation layer is an oxide, a nitride, an oxynitride or an organic resin.

Another aspect of the invention provides an array substrate comprising a base substrate, a plurality of gate lines and a plurality of data lines provided on the base substrate, wherein the data lines are perpendicular to the gate lines, and intersecting of the gate lines and the data lines defines a plurality of pixel regions, wherein each of the pixel regions comprises any one of the aforesaid pixel unit, and wherein for each pixel unit, the gate electrode of the thin film transistor is connected to a corresponding gate line, and the source electrode of the thin film transistor is connected to a corresponding data line.

For example, one gate line is disposed prior to and one gate line is disposed following each row of the pixel units, one data line is respectively disposed on the left side and on the right side of the pixel unit; and only one gate line is disposed between every two adjacent rows of the pixel units, and one data line is provided between every two adjacent columns of the pixel units.

Alternatively, for example, one gate line is disposed prior to and one gate line is disposed following the pixel unit, and two gate lines are disposed between every two adjacent rows of the pixel units; one data line is disposed on the left side or on the right side of each column of the pixel units, and two columns of the pixel units are interposed between every two adjacent data lines.

For example, for each pixel unit, the gate electrode of the thin film transistor is connected to the gate line prior to or following the pixel unit, and the source electrode of the thin film transistor is connected to the data line on the left side or on the right ride of the pixel unit, so as to achieve a Z-inversion pixel structure.

For example, the Z-inversion pixel structure comprises that:

the source electrodes of the thin film transistors in odd-numbered pixel units on a same column are connected to one data line of the data lines on both sides of the column, the source electrodes of the thin film transistors in even-numbered pixel units are connected to the other data line of the data lines on both sides of the column, and the source electrodes of the thin film transistors in pixel units in a same row in two adjacent columns are connected to two different data lines;

the pixel units in a same row are connected alternately to the two gate lines both prior to and following the row of pixel units in every group of two pixel units with the gate electrodes of the thin film transistors included therein, respectively, and the pixel units connected to each of the gate lines are located in same one row; and for thin film transistors in two adjacent pixel units which are located between two data lines adjacent to each other and also in the same row, gate electrodes of them are connected to two gate lines, respectively, and source electrodes of them are connected to the two data lines, respectively.

For example, the array substrate further comprises a common electrode line, and the common electrodes are connected to the common electrode line on a periphery of the array substrate through via holes.

For example, the common electrode of each pixel unit is extended over the one gate line prior to and/or following the pixel unit, so as to form a storage capacitor with the one gate line.

Still another aspect of the invention provides a liquid crystal panel, comprising a color filter substrate and any one of the aforesaid array substrates, the color filter substrate comprising black matrices thereon, wherein on the color filter substrate, at positions in correspondence with the gate lines, at positions in correspondence with the data lines, and at positions in correspondence with boundaries of two columns of pixel units between two adjacent data lines, there are provided black matrices.

For example, black matrices at positions in correspondence with the data lines have a width of 17-23 μm, and black matrices at positions in correspondence with the boundaries of two columns of pixel units between two adjacent data lines have a width of 6-10 μm.

Preferably, black matrices at positions in correspondence with the data lines have a width of 20 μm, and black matrices at positions in correspondence with boundaries of two columns of pixel units between two adjacent data lines have a width of 8 μm.

Another embodiment of the invention further provides a display device, comprising the aforesaid liquid crystal panel.

For example, the display device further comprises a backlight source disposed opposite to a light-entering face of the liquid crystal panel. The backlight source is for example an LED backlight source.

Yet still another aspect of the invention provides a method for manufacturing an array substrate, comprising:

S101, forming a pattern comprising pixel electrodes through a first patterning process, and forming a pattern comprising gate lines and gate electrodes of thin film transistors of pixel units through a second patterning process; or forming a pattern comprising gate lines and gate electrodes of thin film transistors of pixel units through a first patterning process, and forming a pattern comprising pixel electrodes through a second patterning process;

S102, forming a pattern comprising a gate insulating layer, an active layer, data lines and source electrodes and drain electrodes of the thin film transistors through a third patterning process;

S103, forming a pattern comprising a passivation layer through a fourth patterning process; and S104, forming a pattern comprising common electrodes through a fifth patterning process.

For example, the step S102 comprises:

forming a gate insulating layer, an active layer and a source-drain metal thin film sequentially on the base substrate subject to the step S101;

coating a layer of photoresist on the source-drain metal thin film;

exposing the photoresist with a half-tone or gray-tone mask plate, so that the photoresist is formed into a photoresist fully-removed region, a photoresist fully-retained region and a photoresist half-retained region, wherein the photoresist fully-retained region corresponds to a region where the pattern for the data lines, the source electrodes and the drain electrodes is located, the photoresist half-retained region corresponds to channel areas of the thin film transistors, and the photoresist fully-removed region corresponds to a region other than the above patterns; and after a development process, the thickness of the photoresist in the photoresist fully-retained region does not change, the photoresist in the photoresist fully-removed region is fully removed, and the thickness of the photoresist in the photoresist half-retained region becomes thinner;

fully etching off the active layer thin film and the source-drain metal thin film in the photoresist fully-removed region through a first etching process;

removing the photoresist in the photoresist half-retained region entirely by an ashing process, so as to expose the source-drain metal thin film in this region;

fully etching off the source-drain metal thin film in the photoresist half-retained region through a second etching process, so as to form a pattern comprising the pixel electrodes, the data lines, the source electrodes, the drain electrodes, and the channel areas of the thin film transistors; and removing the remaining photoresist.

For example, the active layer thin film comprises a semiconductor thin film and a doped semiconductor thin film, and through the second etching process, the source-drain metal thin film in the photoresist half-retained region is fully etched off, and the doped semiconductor thin film in the channel area is also fully etched off and a partial thickness of the semiconductor thin film is etched off.

For example, the step S103 comprises:

forming a thin film for the passivation layer on the substrate subject to the step S102; and with a half-tone or gray-tone mask plate, forming via holes penetrating the passivation layer and the gate insulating layer above the pixel electrodes, and forming via holes penetrating the passivation layer above the drain electrodes.

For example, the step S104 comprises:

forming a transparent conductive thin film on the substrate subject to the step S103; and forming the pattern of the common electrodes with a normal mask plate.

For example, forming the gate lines in the step S101 comprises forming one gate line prior to and one gate line following each row of pixel units, and only one gate line is formed between every two adjacent rows of pixel units.

For example, forming data lines in the step S102 comprises forming one data line on the left side and on the right side of a pixel unit, and one data line is formed between every two adjacent columns of the pixel units.

For example, or forming gate lines in the step S101 comprises forming one gate line prior to and one gate line following each row of pixel units, and two gate lines are provided between every two adjacent rows of the pixel units.

For example, or forming data lines in the step S102 comprises forming one data line on the left side or on the right side of each column of pixel units, and two columns of pixel units are interposed between every two adjacent data lines.

For example, in the step S101 the gate electrode of the thin film transistor of each pixel unit is connected to the one gate line prior to or following the pixel unit, and in the step S102 the source electrode of the thin film transistor of each pixel is connected to one data line on the left side or on the right side of the pixel unit, so as to achieve a Z-inversion pixel structure.

Likely, for example, the Z-inversion pixel structure comprises that:

the source electrodes of thin film transistors in odd-numbered pixel units in a same column are connected to one data line of the data lines on both sides of the column, the source electrodes of the thin film transistors in even-numbered pixel units are connected to the other data line of the data lines on both sides of the column, and source electrodes of thin film transistors in pixel units in a same row in two adjacent columns are connected to two different data lines;

the pixel units in the same row are connected alternately to two gate lines prior to and following the row of pixel units in every group of two pixel units with gate electrodes of the thin film transistors included therein, respectively, and the pixel units connected to each of the gate lines are located in same one row; and for the thin film transistors in two adjacent pixel units which are located between two data lines adjacent to each other and also in same one row, the gate electrodes of them are connected to two gate lines, respectively, and the source electrodes of them are connected to the two data lines, respectively.

For example, in the step S101, common electrode lines are formed when the gate lines and the gate electrodes are formed, and in the step S104 the common electrodes are prepared connected to the common electrode lines on a periphery of the array substrate through via holes.

For example, in the step S104, a formed common electrode is extended over the one gate line prior to and/or following the pixel unit to which the common electrode belongs, so as to form a storage capacitor with the one gate line.

Yet still another aspect of the invention provides a method for manufacturing a liquid crystal panel, which comprises the above process for manufacturing the array substrate.

For example, the method further comprises a process for manufacturing a color filter substrate, wherein on the color filter substrate, at positions in correspondence with the gate lines, at positions in correspondence with the data lines, and at positions in correspondence with boundaries of two columns of pixel units between two adjacent data lines, there are provided black matrices.

Likewise, for example, the black matrices at positions in correspondence with the data lines have a width of 17-23 μm, and the black matrices at positions in correspondence with boundaries of two columns of pixel units between two adjacent data lines have a width of 6-10 μm.

Preferably, the black matrices at positions in correspondence with the data lines have a width of 20 μm, and the black matrices at positions in correspondence with boundaries of two columns of pixel units between two adjacent data lines have a width of 8 μm.

Yet still another aspect of the invention provides a method for manufacturing a display device, which comprises the above process for manufacturing the liquid crystal panel.

For example, the display device further comprises a backlight source disposed in opposition to a light-entering face of the liquid crystal panel. For example, the backlight source is an LED backlight source.

The pixel unit structure provided by an embodiment of the invention has wider view angles, as compared with a conventional TN mode pixel unit structure; and has advantages such as higher aperture ratio, more stable manufacturing process, possibility of being implemented by a 4-Mask process with a double-tone mask plate, and so on, as compared with a conventional ADS pixel unit structure. For example, compared with a dual-gate structure implemented in common ADS, it is possible to make a common electrode extend over a gate line, shield the impact of signals over the gate line upon the pixel electrode, whereby a width of a black matrix over the gate line is decreased, and aperture ratio is increased. Regarding the array substrates and the manufacturing methods thereof provided by an embodiment of the invention, the resultant I-ADS array substrate has wider view angles as compared with a conventional TN mode array substrate; and moreover, an array substrate with a dual-gate structure and a Z-inversion based on the I-ADS can be implemented to facilitate power consumption reduction. For example, when it is compared with a dual-gate structure implemented in common ADS, it is possible to make a common electrode extend over a gate line, shield the impact of signals over the gate line upon the pixel electrode, whereby a width of a black matrix over the gate line is decreased, and aperture ratio is increased, and accordingly display quality is improved. The liquid crystal panel and manufacturing method thereof, the display device and manufacturing method thereof, which are provided by the embodiments of the invention, comprises the foregoing array substrate and manufacturing method thereof, and accordingly, it is possible that aperture ratio is increased meanwhile power consumption is reduced, thereby improving display quality.

BRIEF DESCRIPTION OF THE DRAWINGS

In order to clearly illustrate the technical solution of the embodiments of the invention, the drawings of the embodiments will be briefly described in the following; it is obvious that the described drawings below are only related to some embodiments of the invention and thus are not limitative of the invention.

Figure 1:
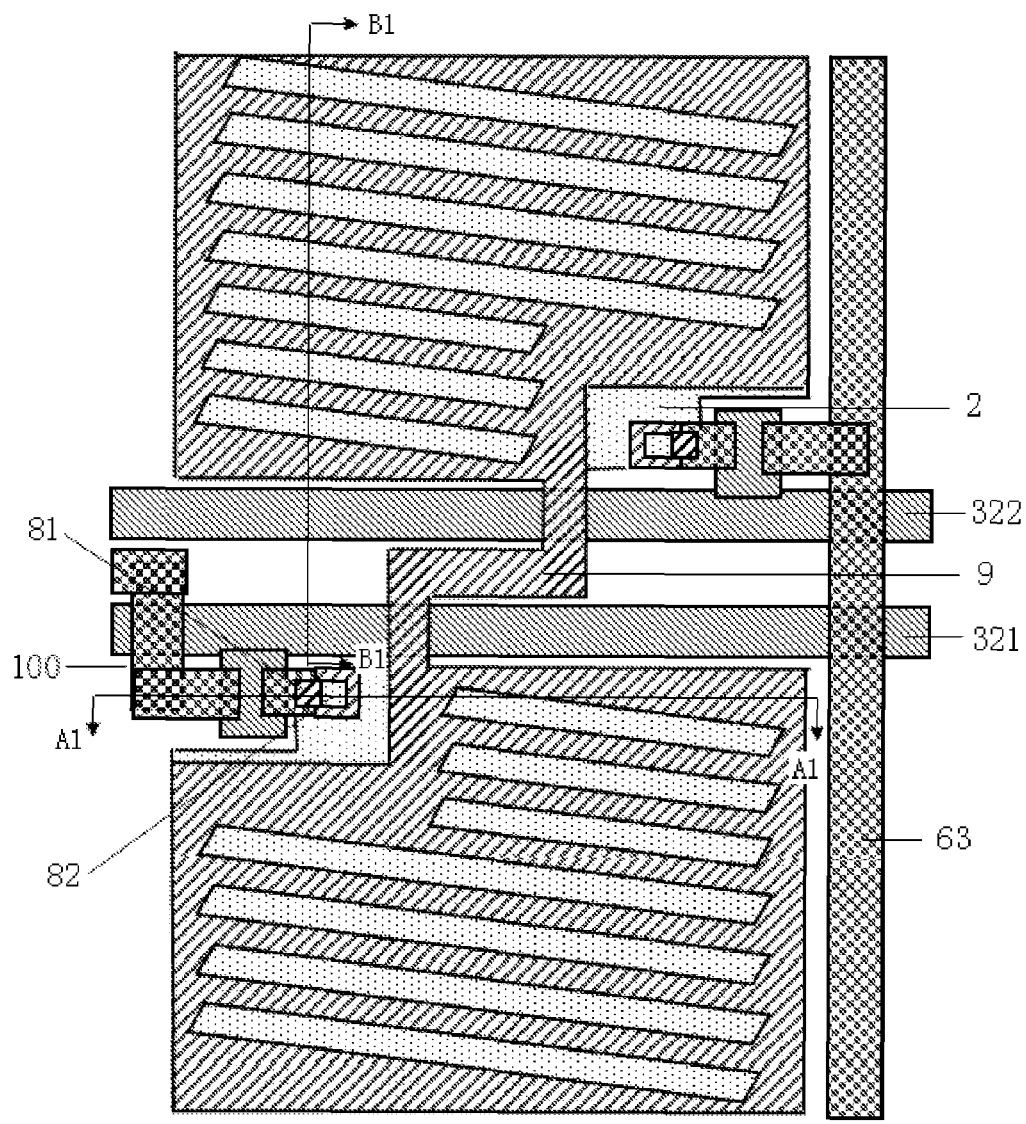
FIG. 1 is a schematic view showing the plan structure of an array substrate (a pixel unit) according to an embodiment of the invention.

REFERENCE NUMERALS 1-substrate; 2-pixel electrode; 31-gate electrode; 321-gate line 1; 322-gate line 2; 4-gate insulating layer; 5-active layer; 61-source electrode; 62-drain electrode; 63-data line; 7-passivation layer; 81-via hole 1; 82-via hole 2; 9-common electrode; 91-connecting electrode; 10-black matrix; 11-array substrate; 12-liquid crystals; 13-color resin; 14-color filter substrate; 100-thin film transistor.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An array substrate according to an embodiment of the invention comprises a plurality of gate lines and a plurality of data lines, these gate lines and data lines intersect each other to define pixel regions arranged in a matrix, each of the pixel regions comprises a pixel unit, and the pixel unit comprises a thin film transistor as a switching element and a pixel electrode and common electrode which are used to control alignment of liquid crystals. The gate electrode of the thin film transistor for each pixel is electrically connected to or integrally formed with a corresponding gate line, the source electrode thereof is electrically connected to or integrally formed with a corresponding data line, and the drain electrode thereof is electrically connected to or integrally formed with a corresponding pixel electrode. The following description is mainly directed to one or more pixel units, but other pixel units may be formed likewise.

Embodiment 1

An embodiment of the invention provides a pixel unit, and the structure of the pixel unit according to the embodiment will be described with reference to FIGS. 1 and 1a. It should be noted that, the pixel unit defined in the embodiment does not include a gate line and a data line. The pixel unit can be used to form a normal array substrate or a dual-gate structured array substrate after the gate line the data line are properly provided.

FIG. 1 is a schematic view showing the plan structure of pixel unit according to the embodiment of the invention, and two pixel units which are longitudinally adjacent to each other in are shown; FIG. 1A is a cross-section view taken along a direction of A1-A1 as shown in FIG. 1, and FIG. 1B is schematic cross-section view taken along a direction of B1-B1 as shown in FIG. 1, that is, FIGS. 1A and 1B are schematic cross-section views of one pixel unit taken along different cutting directions.

The pixel unit in the embodiment comprises a thin film transistor 100, a pixel electrode 2 and a common electrode 9. The thin film transistor 100 comprises a gate electrode 31, a gate insulating layer 4 provided on the gate electrode 31, an active layer 5 provided on the gate insulating layer 4, a source electrode 61 and a drain electrode 62 provided on the active layer 5, and a passivation layer 7 provided on the source electrode 61 and the drain electrode 62. The common electrode 9 is directly provided on the passivation layer 7; the pixel electrode 2 is provided under the passivation layer 7 and connected to the drain electrode 62 of the thin film transistor 100. The pixel electrode 2 may be directly provided under the passivation layer 7, or may be provided under the passivation layer 7 with other intervening film layer(s), for example the gate insulating layer 4, which is also be interposed between the passivation layer 7 and the pixel electrode 2. When the pixel electrode 2 is directly provided under the passivation layer 7, it may directly overlap the drain electrode from below, or may be connected to the drain electrode by other ways. The pixel unit according to the embodiment differs from a conventional ADS one in that, the location relationships in an up-down direction between the pixel electrode and the common electrode are interchanged, and thus, the pixel unit may be called as an Inverse-ADS (I-ADS) type pixel unit.

Preferably, in an example of the embodiment, the pixel electrode 2 and the gate electrode 3 are disposed in a same layer, the gate insulating layer 4 is interposed between the passivation layer 7 and the pixel electrode 2, and a connecting electrode 91 located in the same layer as the common electrode 9 is connected to the drain electrode 62 of the thin film transistor 100 and the pixel electrode 2 through a via hole 81 and a via hole 82, respectively. In the embodiment, the case of disposing the pixel electrode 2 and the gate electrode 3 in the same layer refers to the location relationship between the pixel electrode 2 and the gate electrode 3, but does not means that both are formed with a same material in the same layer. The pixel electrode 2 and the gate electrode 3 may use a same material, or may use different materials.

In the embodiment, it is possible that the common electrode 9 takes a slit shape and the pixel electrode 2 takes a plate shape, or the common electrode 9 and the pixel electrode 2 each take a slit shape. Preferably, the common electrode 9 takes a slit shape, and the pixel electrode 2 takes a plate shape; the pixel electrode 2 and the common electrode 9 in such shapes can be implemented more easily for the structure of the pixel unit according to the embodiment.

Furthermore, the connecting electrode 91 in the same layer as the common electrode 9 adopts a same material as the common electrode 9. Preferably, the connecting electrode 91 and the common electrode 9 are in a same layer and formed in a same procedure.

Preferably, the pixel electrode 2 and/or the common electrode 9 are/is transparent electrode(s).

In the embodiment, the common electrode 9 may be a single-layer film of Indium Tin Oxide (ITO) or Indium Zinc Oxide (IZO), or a composite film composed of ITO and IZO.

In the embodiment, the passivation layer 7 may be, for example, an oxide, a nitride, an oxynitride or an organic resin.

Preferably, in the embodiment, the passivation layer 7 employs an organic resin material; good transparency and insulating characteristic of an organic resin can bring about better aperture ratio and better display effect to a final display device.

In the pixel unit provided by the embodiment of the invention, the common electrode 9 is disposed directly on the passivation layer 7, and the pixel electrode 2 is disposed under the passivation layer 7 and connected to the drain electrode 62 of the thin film transistor, and wider view angles can be realized as compared with a conventional TN mode pixel unit. Moreover, the pixel unit provided by the embodiment of the invention has advantages of higher aperture ratio, more stable manufacturing process, possibility of being manufactured by a 4-Mask process, etc. as compared with a conventional ADS pixel unit; further, as compared with a dual-gate structure implemented in conventional ADS, it can make a common electrode extend over the gate line, shield the impact of signals over the gate line upon the pixel electrode, whereby a width of a black matrix over the gate line is decreased, aperture ratio is increase, and accordingly display quality is improved.

Embodiment 2

This embodiment provides an array substrate comprising a base substrate, and the base substrate is provided thereon with a gate line and a data line perpendicular to the gate line. A pixel region is defined between the gate line and the data line, and the pixel region comprises a pixel unit described in the above Embodiment 1 (may refer to FIG. 1). The gate electrode of the thin film transistor is connected to the gate line, and the source electrode of the thin film transistor is connected to the data line. It should be noted that, the array substrate comprising the above pixel unit may be called as an I-ADS type array substrate; and when compared with a conventional ADS type array substrate, the location position in an up-down direction between the pixel electrode 2 and the common electrode 9 is changed.

In an example of the array substrate according to the embodiment, the gate lines and data lines intersect each other to define an array, gates lines are respectively provided prior to and following the plurality of pixel units of each row, data lines are respectively provided on the left side and on the right side of each of the pixel units, and only one gate line is provided between every two adjacent rows of the pixel units, and one data line is provided between every two adjacent columns of the pixel units. Each of the pixels units is an I-ADS type pixel unit.

In another example of the array substrate according to the embodiment, gate lines are respectively provided prior to and following a plurality of pixel units of each row, and two gate lines 321 and 322 are provided between every two adjacent rows of the pixel units, as shown in FIG. 1. FIG. 1 only illustrates two pixel units on the array substrate which are longitudinally adjacent to each other. A data line is provided on the left side or on the right side of each column of the pixel units, and two columns of the pixel units are interposed between every two adjacent data lines. This is an array substrate in which a dual-gate structure is implemented based on the I-ADS. The pixel arrangement on the entire substrate when the dual-gate structure is implemented can be referred to a schematic view shown in FIG. 8; it should be noted that, FIG. 8 is merely illustrative and does not show the specific pixel structure for each of the pixel units.

Furthermore, the gate electrode of the thin film transistor is connected to the gate line prior to or following the pixel unit to which it belongs, the source electrode of the thin film transistor is connected to the data line on the left side or on the right side of the pixel unit to which it belongs, so as to achieve a Z-inversion pixel structure.

Figure 8:
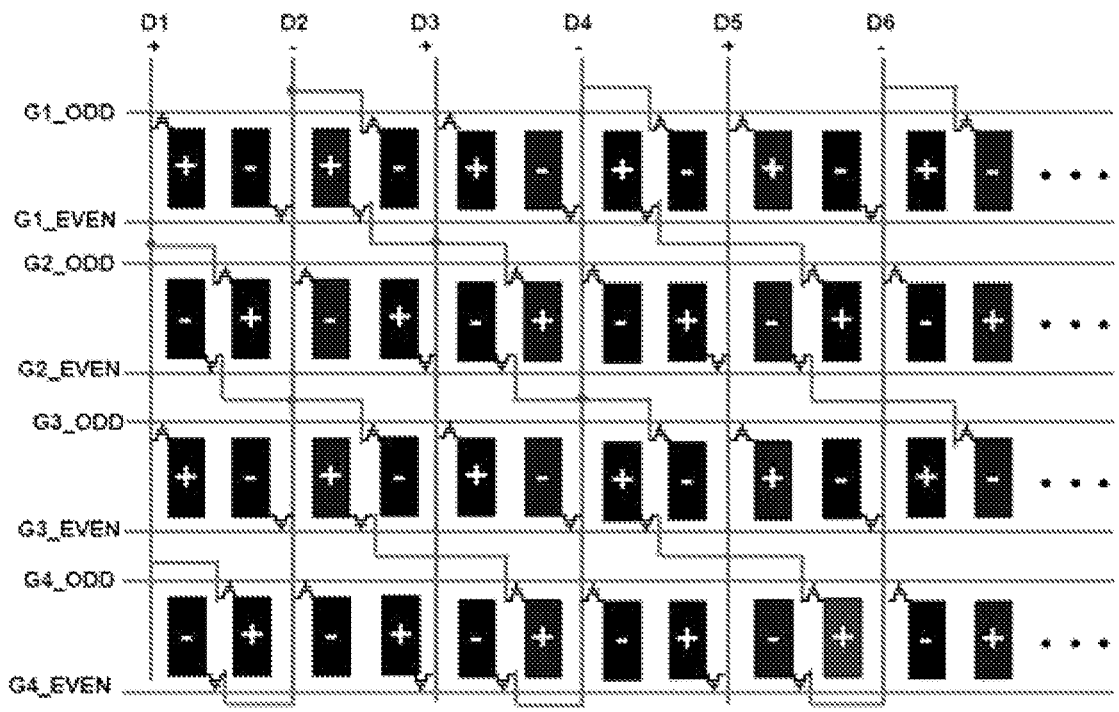
FIG. 8 is another schematic view showing an array substrate according to an embodiment of the invention.

In the embodiment, the schematic view for achieving the Z-inversion pixel structure can be achieved in the following form, as shown in FIG. 8. In the array substrate, the source electrodes of the thin film transistors in odd-numbered pixel units in a same column are connected to one data line of the data lines on both sides of the column, the source electrodes of the thin film transistors in even-numbered pixel units are connected to the other data line of the data lines on both sides of the column, and the source electrodes of thin film transistors in the pixel units in a same row in two adjacent columns are connected to two different data lines. The pixel units in the same row are connected alternately to two gate lines prior to and following the row of pixel units in every group of two pixel units with the gate electrodes of the thin film transistors included therein, respectively, and pixel units connected to each of the gate lines are located in the same row. Moreover, for thin film transistors in two adjacent pixel units which are located between two data lines adjacent to each other and also in a same row, the gate electrodes of them are connected to two gate lines, respectively, and the source electrodes of them are connected to the two data lines, respectively.

In the embodiment, an exemplary, specific structure design of a dual-gate structure is shown in FIG. 1, in which a reference numeral 321 denotes a gate line 1, and 322 denotes a gate line 2, which forms the dual-gate structure. The array substrate with the dual-gate structure and the Z-inversion design in the embodiment can be understood with reference to FIG. 8. Z-inversion can be used to achieve an object of reducing power consumption and enhancing display effect by controlling the same data line so as to control pixels on two sides (left and right sides) thereof. In combination with the dual-gate structure design, each of the data lines can affect pixels of both columns on the left and right sides thereof.

The array substrate and an opposed substrate are disposed opposite to each other to form a liquid crystal cell, and a liquid crystal material is filled within the liquid crystal cell so as to form a liquid crystal panel. The opposed substrate is for example a color filter substrate, and the color filter comprises black matrices defining a plurality of pixel units arranged in a matrix. The pixel units of the color filter substrate correspond to the pixel units of the array substrate. Because the above dual-gate structure is adopted, in the resulting liquid crystal panel, the area of the black matrices (BM) on the color filter substrate can be greatly decreased (because the amount of data lines on the corresponding array substrate is decreased), thereby greatly increasing aperture ratio.

The array substrates of the foregoing two kinds each can further comprise a common electrode line (not shown in figures), and the common electrodes 9 can be connected to the common electrode line through via holes on a periphery of the array substrate.

Further, in the array substrates of two kinds provided by the embodiment, the common electrode 9 can further be extended over a gate line prior to and/or following the pixel unit to which it belongs. This design can shield the impact of signals over the gate line upon the pixel electrode, thereby decreasing the width of the black matrix over the gate line and increase aperture ratio. The exemplary structure can be seen in FIG. 1 or FIG. 1B. FIG. 1 only illustrates two pixel units on the array substrate which are longitudinally adjacent to each other. As shown in FIG. 1, the common electrode 9 in a following pixel unit is extended over the gate line 321, and the common electrode 9 in a preceding pixel unit is extended over the gate line 322. FIG. 1B is a schematic cross-section view taken along a direction of B1-B1 shown in FIG. 1, which also shows that the common electrode 9 in a preceding pixel unit is extended over the gate line 322. Because the common electrode 9 is extended over the gate line, the impact of signals over the gate line upon the pixel electrode can be shielded, whereby the width of the black matrix on the color filter substrate corresponding to the gate line can be reduced and accordingly aperture ratio is improved.

Embodiment 3

The embodiment provides a method for manufacturing an array substrate, comprising the following steps:

S101, forming a pattern comprising a pixel electrode through a first patterning process, and a pattern comprising a gate line and a gate electrode of a thin film transistor through a second patterning process; or, forming a pattern comprising a gate line and a gate electrode of a thin film transistor through a first patterning process, and a pattern comprising a pixel electrode through a second patterning process.

S102, forming a pattern comprising a gate insulating layer, an active layer, a data line, and source and drain electrodes of the thin film transistor through a third patterning process.

S103, forming a pattern comprising a passivation layer through a fourth patterning process.

S104, forming a pattern comprising a common electrode through a fifth patterning process.

Hereinafter, an exemplary manufacturing method of the array substrate according to the embodiment will be described in detail in combination with FIG. 2 to FIG. 5.

There are two ways in the step S101 to be selected, and the following description is based on an example in which the pattern comprising the pixel electrode is formed by the first patterning process and the pattern comprising the gate line and the gate electrode of the thin film transistor is formed through the second patterning process.

Figure 2:
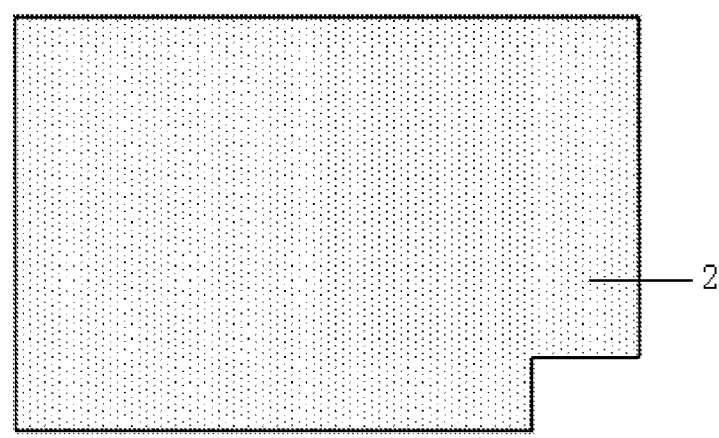
FIG. 2 is a schematic view showing the plan structure of the array substrate subject to a first patterning process.
Figure 2A:
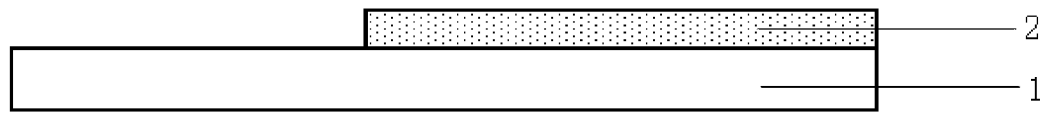
FIG. 2A is a cross-section view taken along a direction of A2-A2 shown in FIG. 2.

FIG. 2 is a schematic plan view showing the array substrate subject to the first patterning process according to the embodiment of the invention, and FIG. 2A is a cross-section view taken along a direction of A2-A2 shown in FIG. 2. For example, by means of sputtering or thermal evaporation, a pixel electrode layer is deposited on a base substrate 1 such as a white glass substrate, the pixel electrode layer may be a transparent conductive thin film, and the transparent conductive thin film may be Indium Tin Oxide (ITO) or Indium Zinc Oxide (IZO), etc. Regarding the formed shape, please refer to FIG. 2. It is possible that a normal mask plate is used to form the desired pattern of a pixel electrode 2 through the first patterning process.

Figure 3:
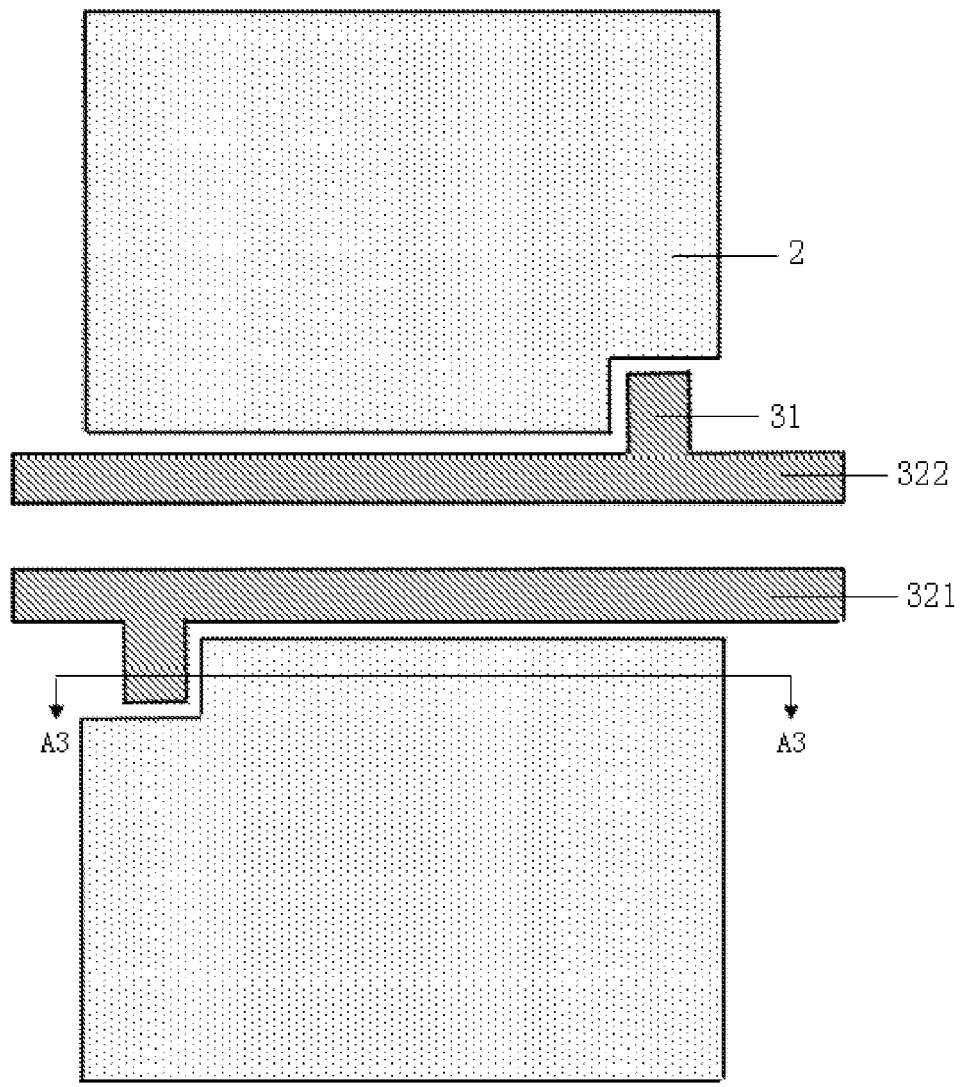
FIG. 3 is a schematic view showing the plan structure of the array substrate subject to a second patterning process.
Figure 3A:
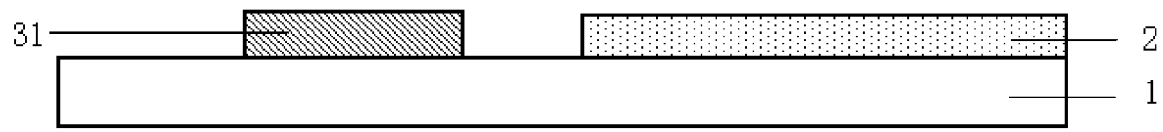
FIG. 3A is a cross-section view taken along a direction of A3-A3 shown in FIG. 3.

FIG. 3 is a schematic plan view showing the array substrate subject to the second patterning process according to the embodiment of the invention, and FIG. 3A is a cross-section view taken along a direction of A3-A3 shown in FIG. 3. For example, by means of sputtering or thermal evaporation, a gate metal thin film is deposited on the base substrate 1. The gate metal thin film may be a single-layer film using a metal of Cr, W, Ti, Ta, Mo, Al, Cu or the like or an alloy thereof, or the gate metal thin film may also be composed of a multilayer of metal thin films. Next, a normal mask plate is used to conduct an etching on the gate metal thin film through the second patterning process, so as to form a pattern for a gate line 321 and a gate line 322 and a gate electrode 31 of a thin film transistor. The gate electrode 31 of the thin film transistor is directly connected to the gate line 321 or 322, that is, they are integrally formed.

What is described in this step is a process method when a dual-gate structure design is obtained. As understood by those skilled in the art, when a common (i.e., single-gate structured) array substrate rather than the dual-gate structured array substrate is to be produced, the structure of a single gate for pixel units in a row is formed.

In the step S102, the pattern comprising the gate insulating layer, the active layer, the data line, and source and drain electrodes of the thin film transistor is formed through the third patterning process.

The third patterning process may be, for example, a process in which the etching is conducted several times, and a double-tone mask plate (e.g., a half-tone or gray-tone mask plate) can be used. An example of the step S102 can comprise:

forming a gate insulating layer 4, an active layer and a source-drain metal thin film sequentially on the base substrate subject to the step S101;

coating a layer of photoresist on the source-drain metal thin film;

exposing the photoresist with a half-tone or gray-tone mask plate, so that the photoresist is formed into a photoresist fully-removed region, a photoresist fully-retained region and a photoresist half-retained region, wherein the photoresist fully-retained region corresponds to a region where the pattern for a data line, a source electrode and a drain electrode is located, the photoresist half-retained region corresponds to a channel area of the thin film transistor, and the photoresist fully-removed region corresponds to a region other than the above patterns; and after a development process, the thickness of the photoresist in the photoresist fully-retained region is not changed, the photoresist in the photoresist fully-removed region is fully removed, and the thickness of the photoresist in the photoresist half-retained region becomes thinner;

fully etching off the active layer thin film and the source-drain metal thin film in the photoresist fully-removed region through a first etching process;

removing the photoresist in the photoresist half-retained region entirely by an ashing process, so as to expose the source-drain metal thin film in this region;

fully etching off the source-drain metal thin film in the photoresist half-retained region through a second etching process, so as to form a pattern comprising a source electrode 61, a drain electrode 62, a data line 63 and the channel area of the thin film transistor; and removing the remaining photoresist.

Figure 4:
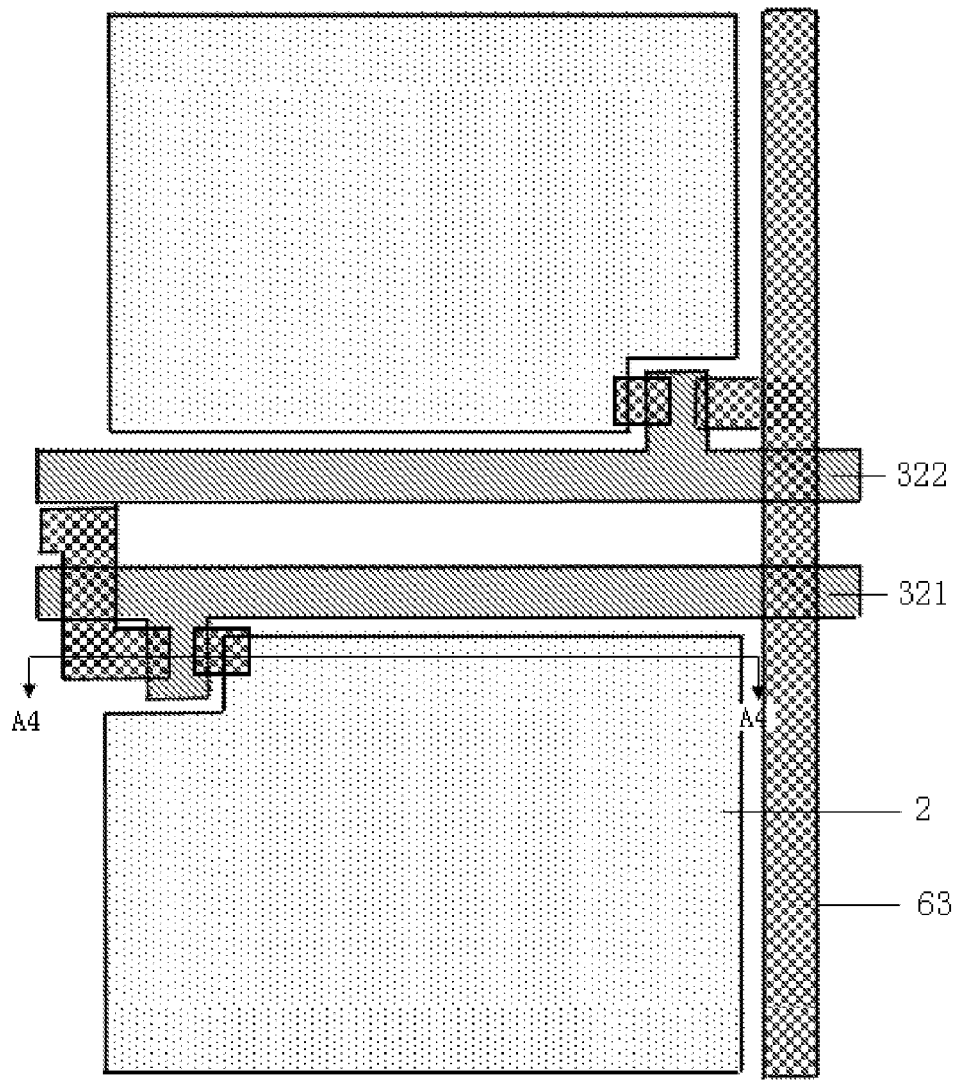
FIG. 4 is a schematic view showing the plan structure of the array substrate subject to a third patterning process.
Figure 4A:
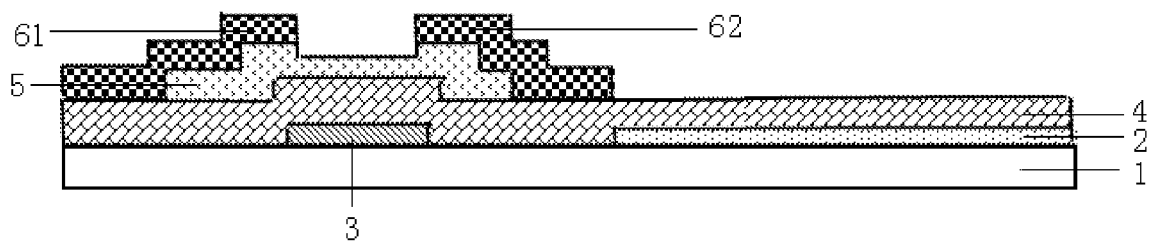
FIG. 4A is a cross-section view taken along a direction of A4-A4 shown in FIG. 4.

FIG. 4 is a schematic plan view showing the array substrate subject to the third patterning process according to the embodiment of the invention, and FIG. 4A is a cross-section view taken along a direction of A4-A4 shown in FIG. 4.

In the embodiment, the active layer thin film may be an oxide semiconductor thin film, an organic semiconductor thin film, or a lamination comprising a semiconductor thin film and a doped semiconductor thin film. When the active layer thin film comprises a semiconductor thin film and a doped semiconductor thin film, by the second etching process, the source-drain metal thin film in the photoresist half-retained region is fully etched off, and the doped semiconductor thin film in the channel area is also fully etched off, and a partial thickness of the semiconductor thin film is etched off.

In the step S103, the pattern comprising the passivation layer is formed through the fourth patterning process.

Figure 5:
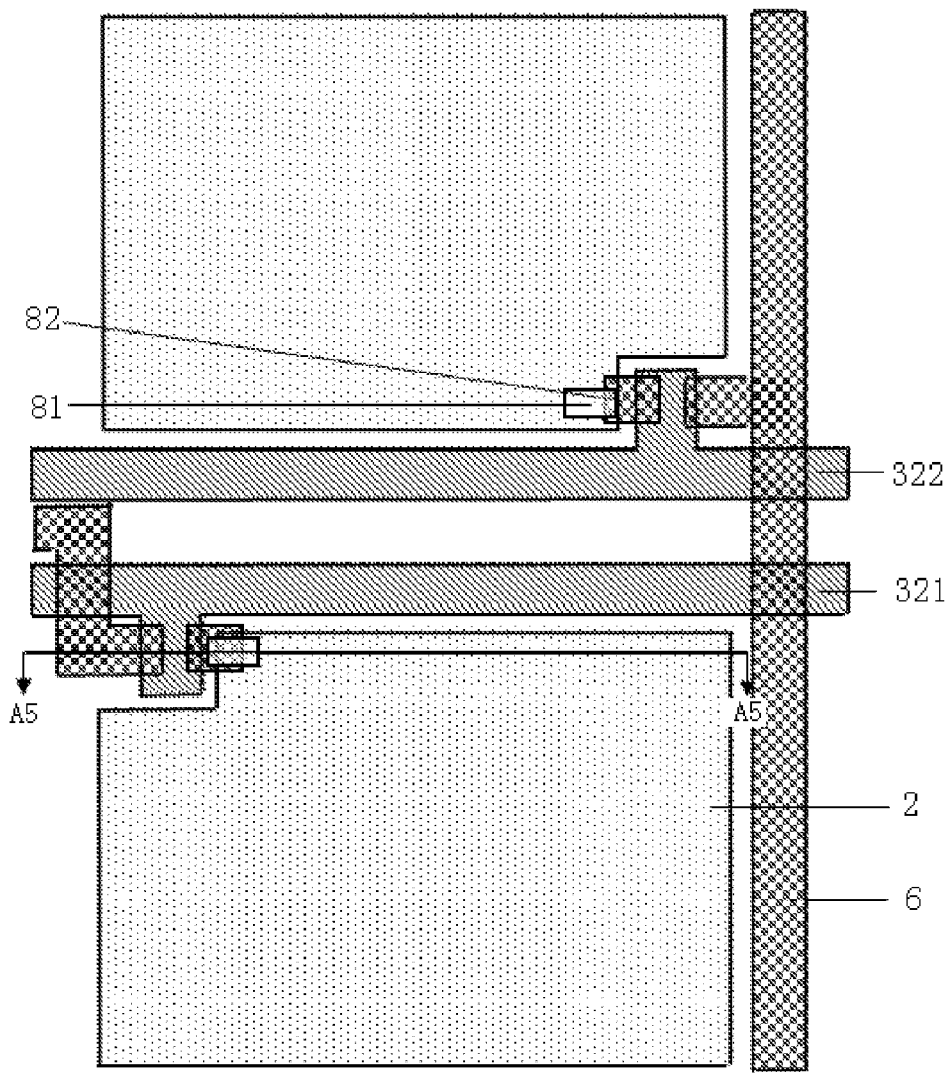
FIG. 5 is a schematic view showing the plan structure of the array substrate subject to a fourth patterning process.
Figure 5A:
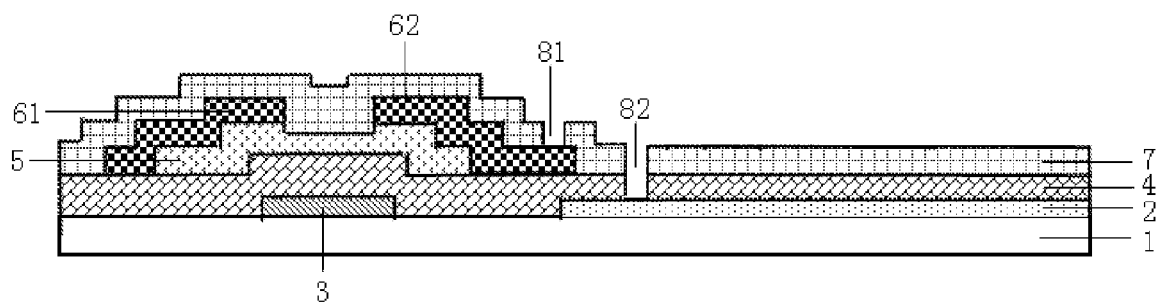
FIG. 5A is a cross-section view taken along a direction of A5-A5 shown in FIG. 5.

FIG. 5 is a schematic plan view showing the array substrate subject to the fourth patterning process according to the embodiment of the invention, and FIG. 5A is a cross-section view taken along a direction of A5-A5 shown in FIG. 5. An example of the step S103 comprises: forming a thin film for the passivation layer on the base substrate subject to the step S102; and by means of a half-tone or gray-tone mask plate, forming a via hole penetrating the passivation layer and the gate insulating layer above the pixel electrode, and forming a via hole penetrating the passivation layer above the drain electrode.

Further, in the embodiment, the thin film for the passivation layer can be deposited on the base substrate by means of plasma enhanced chemical vapor deposition, the thin film for the passivation layer can employ an oxide, a nitride or a oxynitride, and corresponding reactant gas can be mixed gas of SiH4, NH3, and N2 or mixed gas of SiH2Cl2, NH3, and N2. Then, with the use of the half-tone or gray-tone mask plate, through the third patterning process, a via hole 82 penetrating the passivation layer and the gate insulating layer is formed above the pixel electrode, and a via hole 81 penetrating the passivation layer is formed above the drain electrode, as shown in FIG. 5A.

In the step S104, the pattern comprising a common electrode is formed through the fifth patterning process. An example of the step S104 comprises: forming a transparent conductive thin film on the base substrate subject to the step S103; and forming the figure of the common electrode by means a normal mask plate.

Figure 1A:
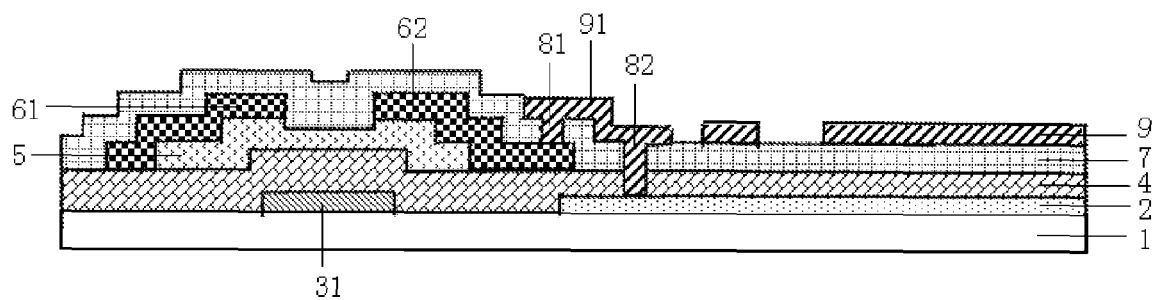
FIG. 1A is a cross-section view taken along a direction of A1-A1 shown in FIG. 1.
Figure 1B:
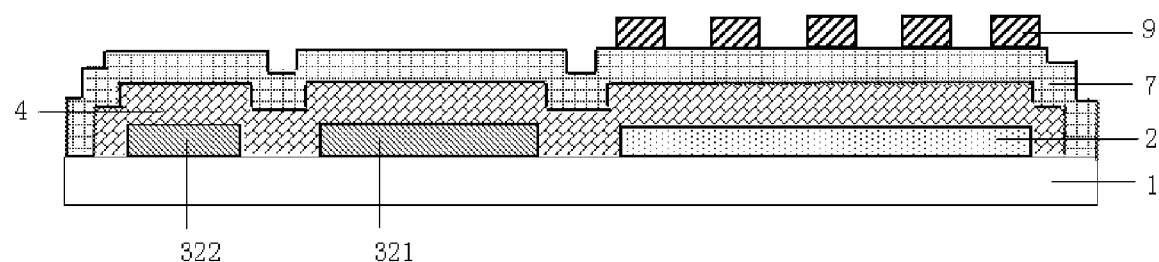
FIG. 1B is a cross-section view taken along a direction of B1-B1 shown in FIG. 1.

FIG. 1 is a schematic plan view showing the array substrate subject to the fifth patterning process according to the invention, FIG. 1A is a cross-section view taken along a direction of A1-A1 shown in FIG. 5, and FIG. 1B is a cross-section view taken along a direction of B1-B1 shown in FIG. 1.

On the based substrate after the via holes 81 and 82 are formed, a transparent conductive thin film is deposited, for example, by means of sputtering or thermal evaporation. At this time, the conductive thin film is filled into the via hole 81 and the via hole 82, so as to achieve the connection between the pixel electrode 2 and the drain electrode 62 of the thin film transistor, and a part of the conductive thin film for connecting the pixel electrode 2 and the drain electrode 62 through the via holes 81 and 82 can be called as a connecting electrode 91. For example, with the use of a normal mask plate, the pattern for the common electrode 9 and the connecting electrode 91 is formed through the fifth patterning process. In the embodiment, the transparent conductive thin film may be a single-layer film of Indium Tin Oxide (ITO) or Indium Zinc oxide (IZO), or may also be a composite film of ITO and IZO. As can be understood by those skilled in the art, the connecting electrode 91 and the common electrode 9 may be formed with a same material in a same patterning process as stated above; or may also be implemented in different patterning processes with a same material or different materials.

The forgoing is only a typical implementing method of the embodiment, and those skilled in the art can also make variations and modification based on this method in combination with well-known knowledge and the conventional technologies, or conduct a specific pixel structure design according to requirements.

For example, in the embodiment, in the step S101, gate lines are formed prior to and following a pixel unit, and only one gate line is formed between every two adjacent rows of pixel units.

For example, in the step S102, data lines are formed on the left side and on the right side of the pixel unit, and one data line is formed between every two adjacent columns of pixel units.

Or, for example, in the step S101, gate lines are formed prior to and following a pixel unit, and two gate lines are formed between every two adjacent rows of pixel units.

Or, for example, in the step S102, the data line is formed on the left side or on the right side of the pixel unit, and two columns of pixel units are interposed between every two adjacent data lines.

Still further, for example, connection of the gate electrode of the thin film transistor to the gate line prior to or following the pixel unit to which it belongs is achieved in the step S101, and the connection of the source electrode of the thin film transistor to the data line on the left side or on the right side of the pixel unit to which it belongs is achieved in the step S102, so as to achieve a Z-inversion pixel structure.

For example, forming the Z-inversion pixel structure in the embodiment can comprise that:

the source electrodes of the thin film transistors in odd-numbered pixel units in a same column are connected to one data line of the data lines on both sides of the column, the source electrodes of the thin film transistors in even-numbered pixel units are connected to the other data line of the data lines on both sides of the column, and the source electrodes of the thin film transistors in pixel units in a same row in two adjacent columns are connected to two different data lines;

the pixel units in a same row are connected alternately to two gate lines prior to and following the row of pixel units in every group of two pixel units with the gate electrodes of the thin film transistors included therein, respectively, and pixel units connected to each of the gate lines are located in a same row;

for thin film transistors in two adjacent pixel units which are located between two data lines adjacent to each other and also in a same row, the gate electrodes of them are connected to two gate lines, respectively, and the source electrodes of them are connected to the two data lines, respectively.

As can be understood by those skilled in the art, in the step S101, for example, a common electrode line can also be formed when the gate line and the gate electrode are formed, and then in the step S104, the common electrode is made to be connected to the common electrode line through a via hole on a periphery of the array substrate.

Further, in the step S104, for example, it is also possible to make the formed common electrode extended over the gate line prior to and/or following the pixel unit to which it belongs, so as to form a storage capacitor with the gate line. The formed specific structure can be seen in FIG. 1 or FIG. 1B. FIG. 1 only illustrates two pixel units on the array substrate which are longitudinally adjacent to each other. As shown in FIG. 1, the common electrode 9 in a following pixel unit is extended over the gate line 321, and the common electrode 9 in a preceding pixel unit is extended over the gate line 322. FIG. 1B is a schematic cross-section view taken along a direction of B1-B1 shown in FIG. 1, which also shows that the common electrode 9 in a preceding pixel unit is extended over the gate line 322. Because the common electrode is extended over the gate line, the impact of signals over the gate line upon the pixel electrode can be shielded by this overlapping structure, whereby a width of a black matrix over the gate line is decreased, and aperture ratio is increased.

Embodiment 4

Figure 6:
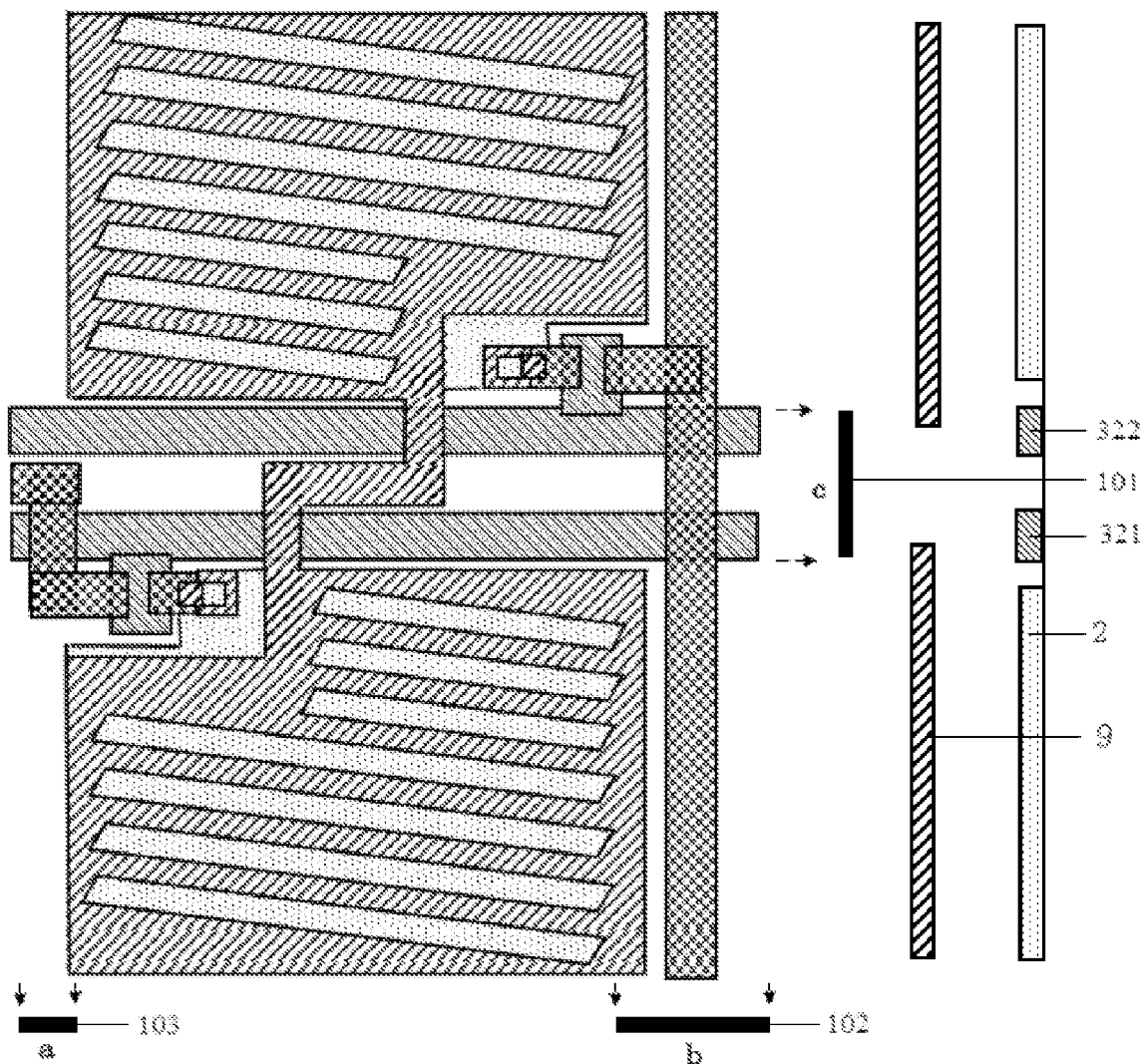
FIG. 6 is a schematic view showing an array substrate according to an embodiment of the invention.
Figure 7:
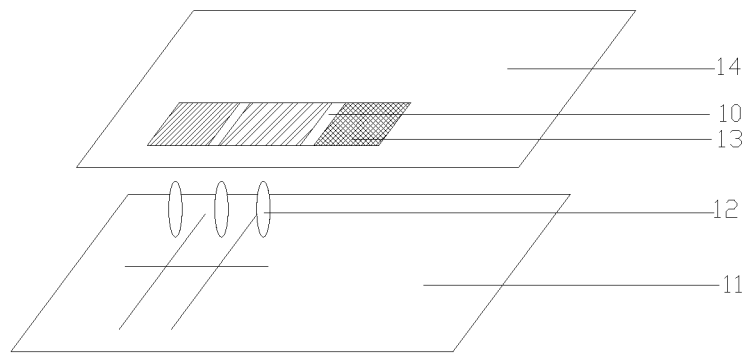
FIG. 7 is schematic view showing a liquid crystal panel according to an embodiment of the invention.

This embodiment provides a liquid crystal panel, as shown in FIG. 7, comprising an array substrate 11, a color filter substrate 14 and liquid crystals 12 filled the two substrates. The array substrate 11 and the color filter substrate 14 are disposed opposite to each other to form a liquid crystal cell, and a plurality of spacers (not shown) are used to maintain a gap between them. The used array substrate is the array substrate provided by any of the above-mentioned embodiments. The color filter 14 comprised black matrices 10 and color resins 13 located thereon. The black matrices 10 define pixel regions of the color filter substrate 14, and these pixel regions correspond to the pixel regions on the array substrate 11. Moreover, on the color filter substrate 14, positions in correspondence with the gate lines, positions in correspondence with the data lines, and positions in correspondence with boundaries of two columns of pixel units between two adjacent data lines each are provided with black matrices, comprising a black matrix 101, a black matrix 102 and a black matrix 103, as shown in FIG. 6. For example, the black matrix 102 at the positions in correspondence with the data lines has a width of 17-23 μm, and the black matrix 103 at the positions in correspondence with the boundaries of two columns of pixel units between two adjacent data lines has a width of 6-10 μm.

Preferably, the black matrix 102 at the positions in correspondence with the data lines has a width of 20 μm, and the black matrix 103 at the positions in correspondence with the boundaries of two columns of pixel units between two adjacent data lines has a width of 8 μm. In this case, it is possible that aperture ratio is improved to the maximum extent meanwhile the display effect is guaranteed (e.g., light leakage is avoided and display uniformity is assured, etc.).

Regarding the width of the black matrix 101, it is not limited herein, and any width capable of achieving its function is applicable. When the common electrode is made to be extended over a gate line, the impact of signals over the gate line upon the pixel electrode can be shielded by the overlapping structure, whereby the width of the black matrix 101 above the gate line can be reduced and accordingly aperture ratio is improved.

Embodiment 5

The embodiment provides a method for manufacturing a liquid crystal panel, comprising the method for manufacturing the array substrate as described in the aforesaid embodiment. The manufactured liquid crystal panel is, for example, shown in FIGS. 6 and 7.

Further, the method for manufacturing the liquid crystal panel further comprises a process for manufacturing a color filter substrate, and on the color filter substrate, positions in correspondence with the gate lines, positions in correspondence with the data lines, and positions in correspondence with boundaries of two columns of pixel units between two adjacent data lines each are provided with black matrices 10. For example, a black matrix 102 at the positions in correspondence with the data lines has a width of 17-23 μm, and a black matrix 103 at the positions in correspondence with the boundaries of two columns of pixel units between two adjacent data lines has a width of 6-10 μm.

Preferably, the black matrix 102 at the positions in correspondence with the data lines has a width of 20 μm, and the black matrix 103 at the positions in correspondence with the boundaries of two columns of pixel units between two adjacent data lines has a width of 8 μm. In this case, it is possible that aperture ratio is improved to the maximum extent meanwhile the display effect is guaranteed (e.g., light leakage is avoided and display uniformity is assured, etc.).

Regarding the width of the black matrix 101, it is not limited herein, and any width capable of achieving its function is applicable. When the common electrode is made to be extended over a gate line, the impact of signals over the gate line upon the pixel electrode can be shielded by the overlapping structure, whereby the width of the black matrix 101 above the gate line can be reduced and accordingly aperture ratio is improved.

Embodiment 6

The embodiment provides a display device, which adopts the liquid crystal panel as described in the aforesaid embodiment. The display device may be a mobile phone, tablet computer, monitor, television, notebook PC, netbook, or the like.

The display device may further include a backlight source disposed in opposition to a light-entering face of the liquid crystal panel. The backlight source may be a CCFL backlight source or an LED backlight source, preferably LED backlight source. The LED backlight can have lower power consumption and better color image display effect.

Embodiment 7

The embodiment of the invention provides a method for manufacturing a display device, which comprises the method for manufacturing the liquid crystal panel as described in the aforesaid embodiment. The display device may be a mobile phone, tablet computer, monitor, television, notebook PC, netbook, or the like.

In the method for manufacturing the display device according to the embodiment, there is further included disposing a backlight source to be opposed to a light-entering face of the liquid crystal panel. The backlight source may be a CCFL backlight source or an LED backlight source, preferably LED backlight source. The LED backlight may have lower power consumption and better color image display effect.

The pixel unit structure provided by any of the embodiments of the invention has wider view angles, as compared with a conventional TN mode pixel unit structure, and has advantages such as higher aperture ratio, more stable manufacturing process, possibility of being manufactured by a 4-Mask process, etc., as compared with a conventional ADS pixel unit structure; further, as compared with a dual-gate structure implemented in conventional ADS, it can make a common electrode extend above a gate line, shield the impact of signals over the gate line upon the pixel electrode, whereby a width of a black matrix over the gate line is decreased, and aperture ratio is increased.

With the array substrates and manufacturing methods thereof provided by any embodiment of the invention, the I-ADS array substrate has wider view angles as compared to a conventional TN mode array substrate; and moreover, an array substrate with a dual-gate structure and a Z-inversion which is implemented based on the I-ADS facilitates reduction of power consumption; and further, as compared with a dual-gate structure implemented in conventional ADS, it can make a common electrode extend above a gate line, shield the impact of signals over the gate line upon the pixel electrode, whereby a width of a black matrix over the gate line is decreased, and aperture ratio is increased, and accordingly display quality is improved.

The liquid crystal panel and manufacturing method thereof, the display device and manufacturing method thereof, which are provided by any embodiment of the invention, comprise the foregoing array substrate and manufacturing method thereof, and accordingly, it is possible that aperture ratio is improved, power consumption is reduced, and display quality is improved.

The foregoing is merely the preferred embodiments of the present invention, but the protection scope of the invention is not limited thereto. All changes or replacements, as would be easily conceived by those skilled in the technical field without departing from the technical scope disclosed by the present invention, should come within the protection scope of the invention. Thus, the protection scope of the present invention should be defined by the protection scope of the following claims.

The invention claimed is:

1. A pixel unit comprising: a thin film transistor, a pixel electrode and a common electrode, the thin film transistor comprising a gate electrode, a gate insulating layer provided on the gate electrode, an active layer provided on the gate insulating layer, a source electrode and a drain electrode which are provided on the active layer, and a passivation layer provided on the source electrode and the drain electrode, wherein the common electrode is provided directly on the passivation layer; and the pixel electrode is provided under the passivation layer and is connected to the drain electrode of the thin film transistor, and wherein the pixel electrode and the gate electrode are disposed in a same layer, a gate insulating layer is provided between the passivation layer and the pixel electrode, and a connecting electrode in a same layer as the common electrode is connected to the drain electrode of the thin film transistor and the pixel electrode through two via holes, respectively.

2. The pixel unit according to claim 1, wherein the common electrode takes a slit shape, and the pixel electrode takes a plate shape.

3. The pixel unit according to claim 1, wherein the pixel electrode and/or the common electrode are/is transparent electrode(s).

4. The pixel unit according to claim 1, wherein the passivation layer is an oxide, a nitride, an oxynitride or an organic resin.

5. An array substrate comprising:
a base substrate,
a plurality of gate lines and a plurality of data lines provided on the base substrate, wherein the data lines are perpendicular to the gate lines, and intersecting of the gate lines and the data lines defines a plurality of pixel regions,
wherein each of the pixel regions comprises a pixel unit according to claim 1, and wherein for each pixel unit, the gate electrode of the thin film transistor is connected to a corresponding gate line, and the source electrode of the thin film transistor is connected to a corresponding data line.

6. The array substrate according to claim 5, wherein one gate line is disposed prior to and one gate line is disposed following each row of the pixel units, and two gate lines are disposed between every two adjacent rows of the pixel units; one data line is disposed on the left side or on the right side of each column of the pixel units, and two columns of the pixel units are interposed between every two adjacent data lines.

7. The array substrate according to claim 6, wherein the gate electrode of the thin film transistor of each pixel unit is connected to the gate line prior to or following the pixel unit, and the source electrode of the thin film transistor of the pixel unit is connected to the data line on the left side or on the right ride of the pixel unit, so as to achieve a Z-inversion pixel structure.

8. The array substrate according to claim 7, wherein the Z-inversion pixel structure comprises that:
source electrodes of thin film transistors in odd-numbered pixel units in a same column are connected to one data line of the data lines on both sides of the column, source electrodes of thin film transistors in even-numbered pixel units are connected to another data line of the data lines on both sides of the column, and source electrodes of thin film transistors in pixel units in a same row in two adjacent columns are connected to two different data lines;
the pixel units in a same row are connected alternately to the two gate lines both prior to and following the row of pixel units in every group of two pixel units with the gate electrodes of the thin film transistors included therein, respectively, and the pixel units connected to each of the gate lines are located in same one row; and
for thin film transistors in two adjacent pixel units which are located between two data lines adjacent to each other and also in same one row, gate electrodes are connected to two gate lines, respectively, and source electrodes are connected to the two data lines, respectively.

9. The array substrate according to claim 5, wherein the common electrode of each pixel unit is extended over the one gate line prior to and/or following the pixel unit, so as to form a storage capacitor with the one gate line.

10. A liquid crystal panel comprising a color filter substrate and an array substrate according to claim 5, the color filter substrate comprising black matrices thereon,
wherein on the color filter substrate, at positions in correspondence with the gate lines, at positions in correspondence with the data lines, and at positions in correspondence with boundaries of two columns of pixel units between two adjacent data lines, there are provided black matrices.

11. A method for manufacturing an array substrate, comprising:
S101, forming a pattern comprising pixel electrodes through a first patterning process, and forming a pattern comprising gate lines and gate electrodes of thin film transistors of pixel units through a second patterning process; or
forming a pattern comprising gate lines and gate electrodes of thin film transistors of pixel units through a first patterning process, and forming a pattern comprising pixel electrodes through a second patterning process;
S102, forming a pattern comprising a gate insulating layer, an active layer, data lines and source electrodes and drain electrodes of the thin film transistors through a third patterning process;
S103, forming a pattern comprising a passivation layer through a fourth patterning process; and
S104, forming a pattern comprising common electrodes through a fifth patterning process,
wherein the pixel electrodes and the gate electrodes are disposed in a same layer, the gate insulating layer is provided between the passivation layer and the pixel electrode, and the connecting electrode in a same layer as the common electrode is connected to the drain electrode of the thin film transitor and the pixel electrode through two via holes, respectively.

12. The method for manufacturing the array substrate according to claim 11, wherein forming the gate lines in step S101 comprises forming one gate line prior to and one gate line following each row of the pixel units, and providing two gate lines between every two adjacent rows of the pixel units;
wherein forming the data line formed in step S102 comprises forming one data line on the left side or on the right side of each column of the pixel units, and two columns of the pixel units are interposed between every two adjacent data lines.

13. The method for manufacturing the array substrate according to claim 12, wherein in step S101 the gate electrode of the thin film transistor of each pixel unit is connected to the gate line prior to or following the pixel unit, and in step S102 the source electrode of the thin film transistor of each pixel is connected to the data line on the left side or on the right side of the pixel unit, whereby a Z-inversion pixel structure is achieved.

14. The method for manufacturing the array substrate according to claim 11, wherein in step S104, a formed common electrode is extended over the one gate line prior to and/or following the pixel unit to which the common electrode belongs, so as to form a storage capacitor with the one gate line.

* * * * *